United States Patent [19]

Kasahara

[11] Patent Number: 4,878,055
[45] Date of Patent: Oct. 31, 1989

[54] REMOTE CONTROL DEVICE

[75] Inventor: Yoshiki Kasahara, Hamamatsu, Japan

[73] Assignee: Yamaha Corporation, Hamamatsu, Japan

[21] Appl. No.: 210,080

[22] Filed: Jun. 22, 1988

[30] Foreign Application Priority Data

Jun. 22, 1987 [JP] Japan .................................. 62-9466

[51] Int. Cl.⁴ ............................................ H03M 11/00
[52] U.S. Cl. ....................................... 341/23; 455/603; 340/825.72; 358/194.1
[58] Field of Search ............ 340/365 VL, 712, 825.69, 340/825.72; 341/23, 22; 455/151, 352, 603; 358/194.1

[56] References Cited

U.S. PATENT DOCUMENTS

| | | | |
|---|---|---|---|
| Re. 31,649 | 8/1984 | Brodbeck | 340/365 VL |
| 3,560,964 | 2/1971 | Bedell et al. | 340/365 VL |
| 4,439,757 | 3/1984 | Gross et al. | 340/365 VL |
| 4,712,105 | 12/1987 | Köhler | 341/23 |
| 4,745,397 | 5/1988 | Lagerbauer et al. | 358/194.1 |

Primary Examiner—Donald J. Yusko
Assistant Examiner—Tyrone Queen
Attorney, Agent, or Firm—Spensley Horn Jubas & Lubitz

[57] ABSTRACT

The remote control device is equipped with at least one movable panel arranged rotatably to cover an operation panel having a plural number of operation keys arranged thereon, so composed as to permit manipulating the operation keys from an upper side of the movable panel and having function markings imprinted thereon, and is composed in such a manner that, when the operation panel is covered with the movable panel, a remote control transmitter is switched to the function mode displayed on the movable panel and transmits, upon operating the same keys, signals different from those sent out while the operation panel is not covered with the movable panel. The movable panel is made of a flexible material or equipped with windows formed at the positions corresponding to the operation keys, and locked when it is set at the position covering the operation panel.

8 Claims, 5 Drawing Sheets

REMOTE CONTROL DEVICE

BACKGROUND OF THE INVENTION (a) FIELD of the Invention

The present invention relates to a function mode switchable remote control device so adapted as to be capable of switching remote control functions allocated to operation keys with a function switching means and displaying functions of various modes on a remote control transmitter (b) Description of the Prior Art On the transmitter in a remote control device used with the audio apparatus or TV set, a single function is generally allocated to each operation key. On a remote control transmitter capable of switching function modes, in contrast, a plural number of functions are allocated to a single operation key and function modes are switched with a function selector switch or the similar means. By switching the function modes, a code or a signal to be transmitted by operating the same key is switched so that a main apparatus controlled by the transmitter performs a different function. Such function switching is utilized, for example, to diversify functions without increasing the number of operation keys or to modify arrangement of the keys.

In case of function switching of the operation keys, a problem lies in the way how to simplify the formation and how to make legible the display of the functions of the individual keys. As the conventional methods for displaying the functions, it is known to mark the plural functions in various modes in the vicinity of the individual keys and, also known to dispose a display in the vicinity of the individual key and switch the display in response to the function mode switching on LEDs (light emitting diodes) or LCDs (liquid crystal displays).

However, the above-mentioned method to mark plural functions in the individual keys has a defect that the markings are crowded and not legible, thereby making the markings rather inconvenient for practical use. On the other hand, the display using the LEDs or LCDs has a drawback that it requires a display circuit, etc., thereby being complicated in formation and high in the price thereof. Further, the numbers of operation keys and electrical circuits are increased, and formation of the display is complicated when it is attempted to design a display in such a manner that it permits a user to freely set or modify functions of the operation keys. Moreover, the display of the latter type requires a power source, which is usually storage batteries having a short service life and turned off for energy saving while the main apparatus is rested, thereby producing inconvenience that said display does not allow a user to read out the functions of the operation keys at a glance when the power source is turned off.

SUMMARY OF THE INVENTION

In view of the circumstances described above, it is a primary object of the present invention to provide a function mode switchable remote control device capable of displaying functions in a simple and legible manner.

Another object of the present invention is to provide a function mode switchable remote control device which is simple in formation, convenient for use and manufacturable at a low cost.

A still another object of the present invention is to provide a function mode switchable remote control device so adapted as to allow a user to freely and easily mark the functions set or modified by the hand of the user himself.

A further object of the present invention is to provide a function mode switchable remote control device which allows no deviation between the displayed functions and actually selected functions.

According to the present invention, these objects are accomplished by equipping a remote control device with at least one movable panel which is rotatably arranged so as to cover an operation panel having a plural number of operation keys arranged thereon, so composed as to permit operating said operation keys from thereover, and has markings indicating the functions of said operation keys imprinted thereon, and with a switching operation means for switching a function switching means to the function mode appearing above said operation panel in conjunction with rotation of said movable panel.

According to the present invention, a function mode is switched and a newly selected function is displayed on the operation panel by or in conjunction with rotation of the movable panel. Accordingly, only the function of the currently selected mode is displayed, unlike the conventional markings of functions in the crowded manner, thereby assuring high convenience in practical use. Further, the remote control device according to the present invention is not of the conventional electric type using LEDs or LCDs, but is simple in its formation, manufacturable at a low cost, allows to read out the markings at all times and consumes no electric power for display. Furthermore, the remote control device according to the present invention allows a user to freely mark functions set or modified by the user himself in a simple procedure. Moreover, since the display of the remote control device according to the present invention is interlocked with the function switching means, the remote control device has eliminated the necessity to perform switching of the function modes and switching of the display separately or independently, assures high convenience in practical use, and is free from the fear of deviation between displayed function and actually selected function These and other objects as well as the features and advantages of the present invention will become apparent from the following detailed description of the preferred embodiments when taken in conjunction with the accompanying drawings.

DETAILED DESCRIPTION OF THE PREFERRED EMBODIMENTS

Figure 1:
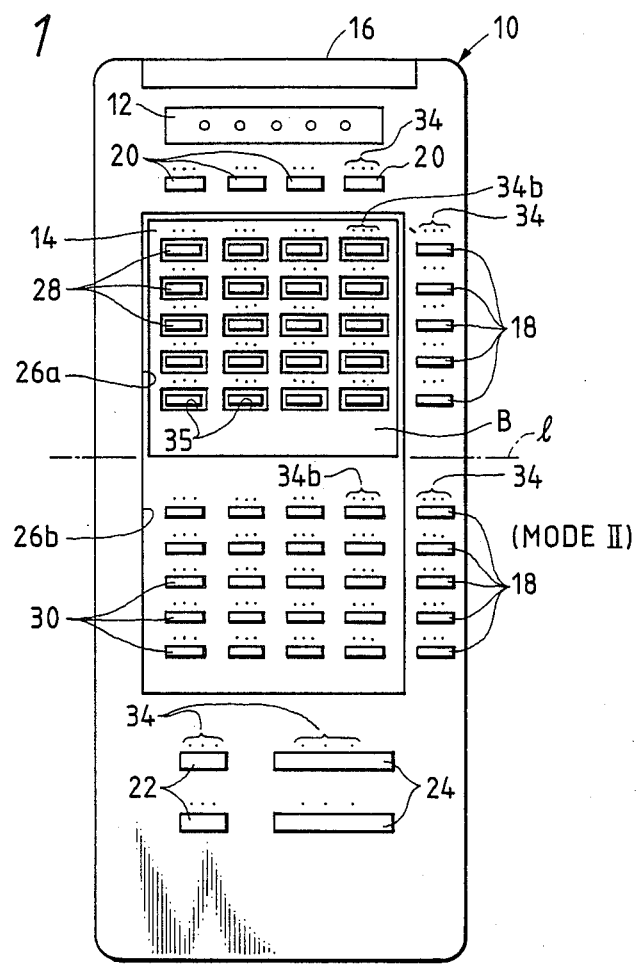
FIG. 1 is a front elevation of the remote control device preferred as an embodiment of the present invention.
Figure 2:
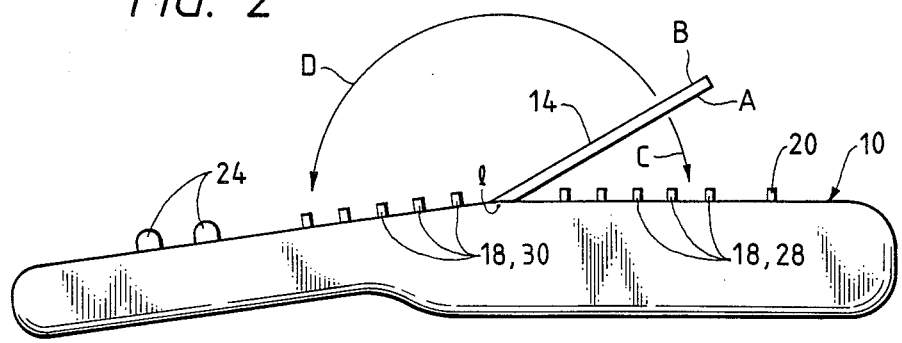
FIG. 2 is a right side view of the remote control device shown in FIG. 1.

Illustrated in FIG. 1 and FIG. 2 is a remote control transmitter as Embodiment 1 of the present invention which is designed for switching functions at two stages of mode I and mode II.

This remote control transmitter is equipped with learning functions capable of receiving code signals from another remote control transmitter, analyzing, storing and transmitting said code signals as commanded by operations performed by a user.

Arranged on an operation panel 10 of the remote control transmitter are various types of operation keys, LEDs 12 indicating learning modes, a movable panel 14 and so on. Further, a transmitter lens 16 is embedded into one end of the transmitter. Built in the operation panel 10 are key switches, various circuits, mode selector switches, storage battery, etc. connected to the operation keys. When any one of the operation keys is depressed, a code signal corresponding to the key is emitted with carrier through the transmitter lens 16 to operate the main apparatus.

The operation keys consist of the ten numerical keys 18 and other keys 20, 22 and 24 to be used commonly in various modes. Further, arranged in central cavities 26a and 26b are keys 28 and 30 as function selector operation keys.

Function markings 34 are imprinted (FIG. 1) above the operation keys 18, 20, 22 and 24 on the operation panel 10 for indicating the functions of the keys respectively.

The movable panel 14 is so composed as to be freely rotatable around a shaft 1 used as a rotation axis and felled down on the side of the concavity 26a or 26b. Formed in the movable panel 14 are windows 35 so that the operation keys 28 or 30 protrude through the windows 35, when the movable panel 14 is felled down on the side of the concavity 26a or 26b, and can be operated from above the movable panel 14.

The functions in the mode I are marked above the windows on the surface A (not shown) of the movable panel 14, whereas the functions in the mode II are marked above the windows 35 on the surface B. Further, the functions in the mode I are marked (not shown) also on the operation panel 10 at the positions above the keys 28 located within the concavity 26a, whereas the function markings 34b in the mode L are imprinted also on the operation panel 10 at the positions above the keys 30 located within the concavity 26b.

When the movable panel 14 is rotated on the side of the concavity 26a (in the direction indicated by the arrow C in FIG. 2), the function selector switch (not shown) provided as a function switching means is automatically set so as to select the mode L. When the movable panel 14 is rotated on the side of the concavity 26b (in the direction indicated by the arrow D in FIG. 2), in contrast, the function selector switch is automatically set so as to select the mode I. The function selector switch is set, for example, so as to allow the remote control transmitter to select UHF channels in the mode I and VHF channels in the mode L. Alternately, the function selector switch is turned so as to allow the remote control transmitter to operate with a TV set in the mode I and with a FM receiver in the mode II.

When the function selector switch is turned for function switching, code signal, carrier frequency, etc., for the operation keys are changed, and the main apparatus performs an operation different from those before the function switching. At this time, the function markings above the operation keys 28 and 30 are exchanged with those in the selected mode. Speaking concretely, when the movable panel 14 is turned in the direction indicated by the arrow D shown in FIG. 2 to select the mode I, the function markings in the mode I are provided, i.e., the function markings imprinted on the operation panel 10 are provided for the operation keys 28, whereas the function markings imprinted on the surface A of the movable panel 14 are provided for the operation keys 30. Further, when the movable panel 14 is turned in the direction indicated by the arrow C in FIG. 2 to select the mode L, the function markings in the mode L are provided, i.e., the function markings imprinted on the surface B of the movable panel 14 are provided for the operation keys 28, whereas the function markings imprinted in the concavity 26b of the operation panel 10 are provided for the operation keys 30. Since the remote control transmitter automatically displays the functions of the selected mode when the function mode is switched by turning the movable panel 14, the transmitter helps a user perform key operation without fail.

In addition, when the positions of the function markings are left blank on the operation panel 10 and movable panel 14 so as to allow entry at a later stage, it is possible for a user to freely enter markings of functions set later by utilizing the learning function.

Figure 3:
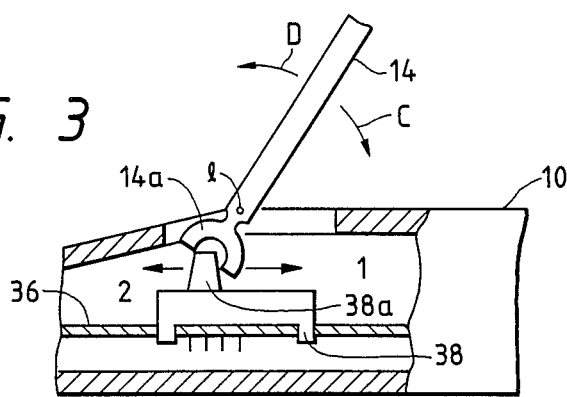
FIGS. 3 through 5 are partially broken side views of examples of the switching operation means different from one another.
Figure 4:
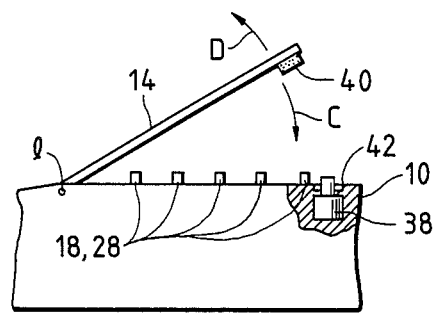
Figure 5:
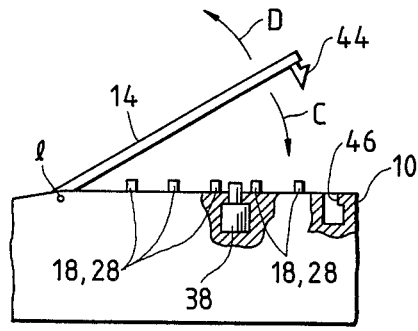

The switching operation means for switching functions in conjunction with rotation of the movable panel 14 can be composed as illustrated in FIGS. 3 through 5. That is to say, the example of the switching operation means shown in FIG. 3 consists of the movable panel 14 and an engaging member 14a formed at an end thereof, and is designed in such a manner that it is capable of changing over a slide switch 38 in conjunction with rotation of the movable panel 14 by engaging the engaging member 14a with an operation member 38a of a function selector means (slide switch) 38 assembled on a printed circuit board 36 arranged in the remote control transmitter. In the example shown in FIG. 4, a tact switch is assembled in the operation panel 10 as a function selector means 38 so that modes are switched by pressing the tact switch with the movable panel 14. A magnet 40 is attached to the bottom surface at one end of the movable panel 14 and a magnetic material 42 is embedded in the operation panel respectively so that a selected mode is maintained securely by pressing the tact switch 38 under the magnet 40 attracted to the magnetic material 42. In the example illustrated in FIG. 5, a hook 44 is used in place of the magnet 40 adopted in the example shown in FIG. 4. Speaking more concretely, the hook 44 is attached to the bottom surface at one end of the movable panel 14 and an engaging hole 46 is formed in the operation panel 10. When the movable panel 14 is turned in the direction indicated by the arrow C, the tact switch is changed over and, at the same time, the hook 44 engages with the engaging hole 46 to maintain the switched state.

Figure 6:
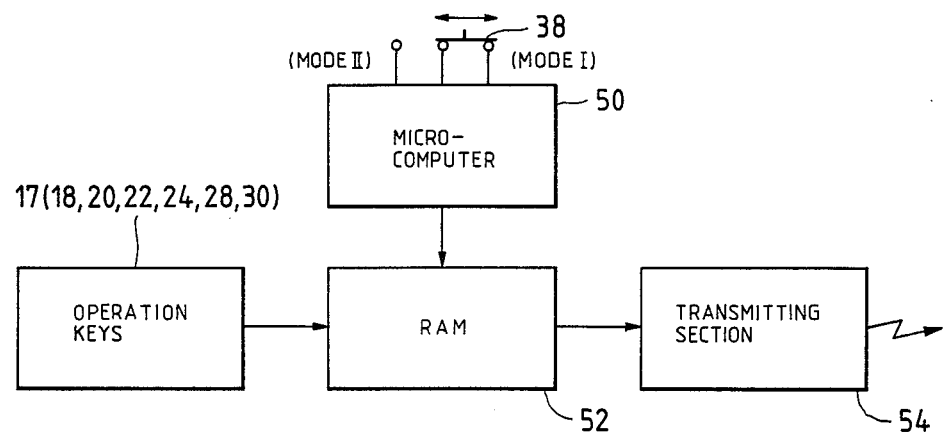
FIG. 6 is a block diagram exemplifying the circuit arranged in the remote control transmitter.

When the function switching is performed, the electrical circuit built in the remote control transmitter functions in such a manner that a microcomputer 50 detects switching of the function selector means 38 as shown in FIG. 6 and modifies read-out area of RAM 52 for operation of each of the operation keys 17, and code signals different from those before the function switching are read out and sent out in a form of light or radio wave from the transmitter via a transmitting section 54.

The main apparatus receives the code signals and performs operations different from those before the function switching for operations of the same operation keys.

In addition to the examples described above, micro switches, reed switches and other switching means can be used as the function selector means 38.

Figure 7:
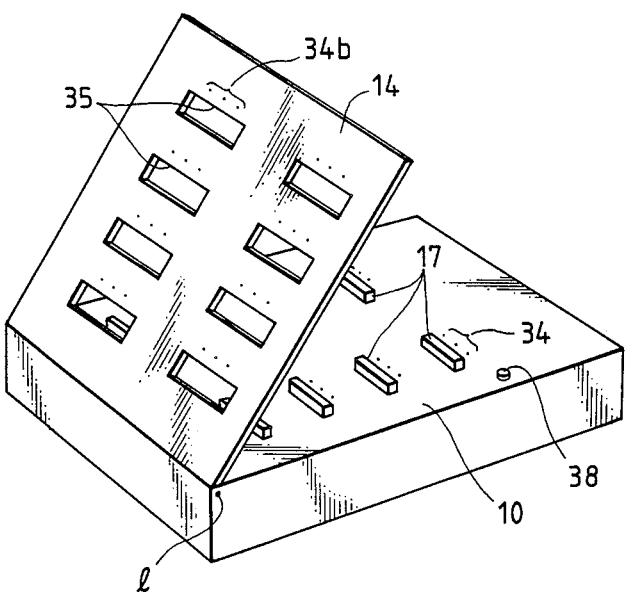
FIGS. 7 through 10 are perspective views illustrating other embodiments different from one another of the present invention.

Though the shaft 1 for rotating the movable panel 14 is located at the center of the operation panel 10 and the function markings are imprinted on both the surfaces thereof in the embodiments illustrated in FIGS. 1 through 5, it is possible to set the shaft ( for rotation at one end of the operation panel 10 of the remote control transmitter as shown in FIG. 7. In this case, the function markings in the mode I are imprinted on the operation panel 10 and the function markings in the mode L are imprinted on the upper surface only of the movable panel 14.

Figure 8:
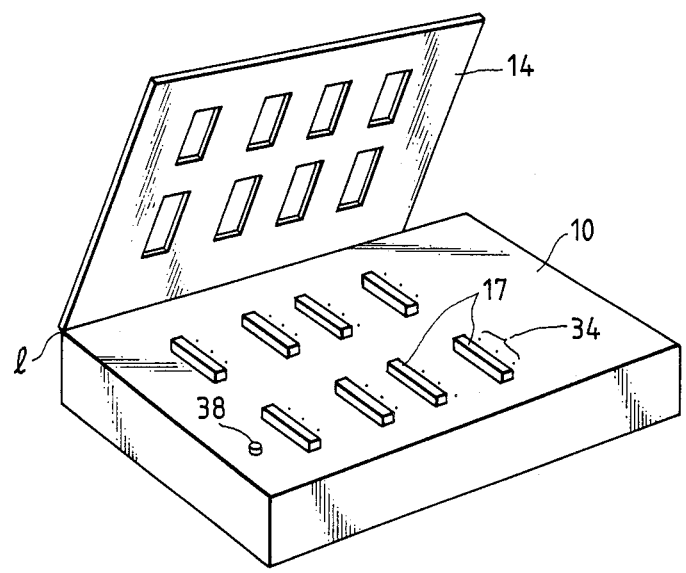

Though the movable panel 14 is rotated around a shaft perpendicular to the longitudinal direction of the operation panel 10 in each of the examples described above, it is possible to turn the movable panel 14 around a shaft ( along the longitudinal direction of the operation panel 10 as shown in FIG. 8 or a shaft extending obliquely relative to the longitudinal direction of the operation panel 10.

Figure 9:
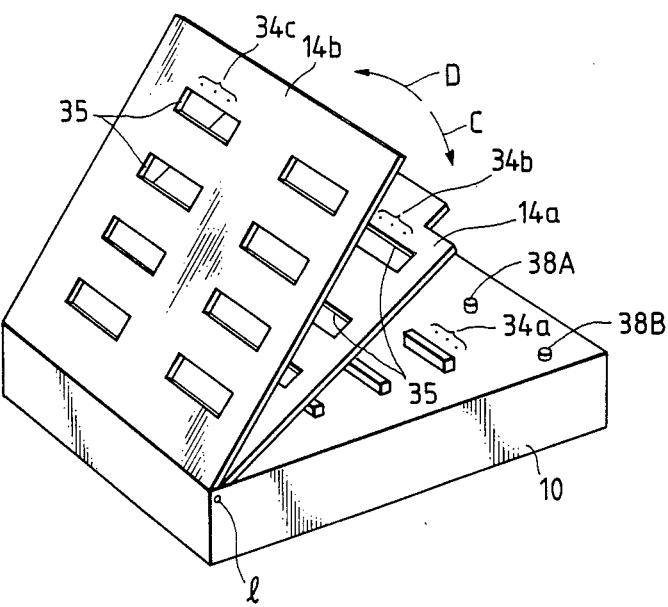
Figure 10:
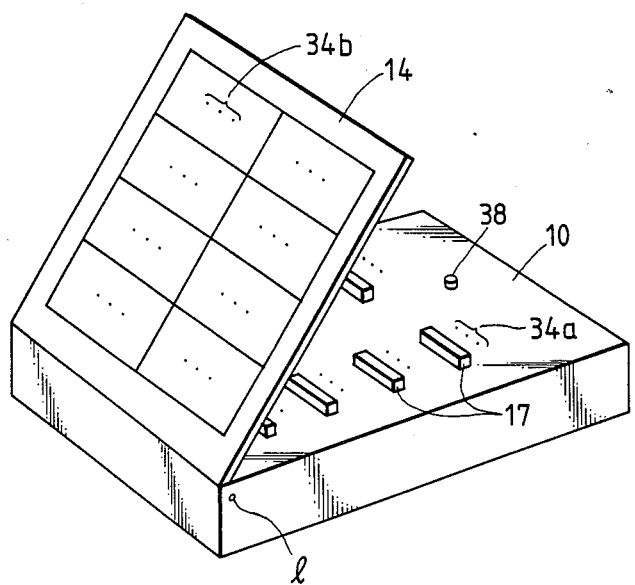

Further, though a single movable panel 14 is used in the embodiment described above, it is possible to use two or more movable panels as illustrated in FIG. 9. That is to say, when two movable panels are used, function markings 34a in mode I are imprinted, for example, on the operation panel 10 of the remote control transmitter, function markings 34b in mode II are imprinted on a movable panel 14a and the function markings 34c in mode II 34c are imprinted on a movable panel 14b. The function selector means is switched to mode I when both the movable panels 14a and 14b are turned in the direction indicated by the arrow D, the function selector means is switched to the mode II when the movable panel 14a only is turned in the direction indicated by the arrow C, and the function selector means is switched to the mode III when both the movable panels 14a and 14b are turned in the direction indicated by the arrow C. In this case, it is possible to compose the function switching means, for example, of two switches 38A and 38B arranged on the operation panel 10 so as to be operated by the movable panels 14a and 14b, and switch the modes by a combination of conditions of these two switches (the mode I is selected by turning off both the switches, the mode II is selected by turning off one of the switches, and the mode III is selected by turning on both the switches).

Though the movable panel 14 has windows 35 which are so adapted as to allow the operation keys to protrude therethrough in each of the embodiments described above, the windows 35 may not be formed when a flexible panel permitting manipulation of the operation keys from thereover is used as at least a manipulated portion of the movable panel 14.

Since the remote control transmitter according to the present invention is so adapted as to automatically switch the function modes by turning the movable panel so as to cover the operation panel and provide function markings of the functions selected by the function switching on the movable panel as described with reference to the embodiments, the remote control device makes legible the markings only of the functions in a selected mode unlike the conventional crowded markings of the functions in plural modes and assures high convenience in practical use. Further, the remote control device according to the present invention is simple in the formation thereof, manufacturable at a low cost, capable of always allowing readout of the function markings and free from the problem of electric power consumption. Furthermore, the remote control device according to the present invention easily allows a user to freely enter functions set or modified by himself. Moreover, since the remote control device according to the present invention interlocks the mode selector means for mode switching with the movable panel, it eliminates the necessity to perform the function mode switching and marking changeover separately and independently, assures high convenience in practical use, and prevents the fear of deviation between displayed functions and actually selected functions.

What is claimed is:

1. A wireless remote control device so adapted as to permit changing remote control functions allocated to operation keys, comprising:
    a body having a wireless transmitter for transmitting at least one of audio and video control signals;
    an operation panel on the body equipped with a plural number of operation keys;
    a function switching means for changing the functions of said operation keys;
    at least one movable panel arranged pivotably to cover said operation panel, so composed as to permit operating said operation keys from an upper side of said movable panel and having markings imprinted on the surface thereof to indicate the functions of said operation keys; and
    a switching operation means capable of switching said function switching means to the function mode displayed on said movable panel in conjunction with rotation of said movable panel.

2. A remote control device according to claim 1 wherein said movable panel has a plural number of windows formed at the positions corresponding to said operation keys for allowing said operation keys to protrude above said movable panel.

3. A remote control device according to claim 1 wherein at least a manipulated portion of said movable panel is made of a flexible material.

4. A remote control device according to claim 1 wherein said function switching means is a slide switch or a tact switch.

5. A remote control device according to claim 1 wherein said switching operation means is said movable panel.

6. A remote control device according to claim 5 wherein said operation panel and said movable panel are equipped with lock means for maintaining said movable panel in the state covering said operation panel.

7. A remote control device according to claim 1 wherein said movable panel is provided with a portion where a user can freely enter function markings on said movable panel.

8. A remote control device according to claim 1 wherein the body further includes a memory storing code signals which are read out from the memory and transmitted as said control signals and control means responsive to the function switching means for causing different code signals to be read out from the memory in response to depression of a particular operation key.

* * * * *